United States Patent
Terranova

(10) Patent No.: US 7,760,126 B2
(45) Date of Patent: Jul. 20, 2010

(54) FLASH CONVERTER DIFFERENTIAL REFERENCE LADDER AUTO-ZERO CIRCUIT

(75) Inventor: Domenic F. Terranova, North Andover, MA (US)

(73) Assignee: Kenet, Inc., Woburn, MA (US)

( * ) Notice: Subject to any disclaimer, the term of this patent is extended or adjusted under 35 U.S.C. 154(b) by 31 days.

(21) Appl. No.: 12/330,272

(22) Filed: Dec. 8, 2008

(65) Prior Publication Data

US 2009/0153386 A1 Jun. 18, 2009

Related U.S. Application Data

(60) Provisional application No. 61/005,791, filed on Dec. 7, 2007.

(51) Int. Cl.
*H03M 1/36* (2006.01)
(52) U.S. Cl. .................................. 341/159; 341/155
(58) Field of Classification Search .......... 341/120–172
See application file for complete search history.

(56) References Cited

U.S. PATENT DOCUMENTS

| | | | | |
|---|---|---|---|---|
| 4,912,470 A | * | 3/1990 | Hosotani et al. | 341/159 |
| 5,231,399 A | * | 7/1993 | Gorman et al. | 341/159 |
| 5,867,116 A | * | 2/1999 | Nakamura et al. | 341/159 |
| 6,459,394 B1 | * | 10/2002 | Nadi et al. | 341/120 |
| 6,661,365 B1 | * | 12/2003 | Bugeja | 341/160 |
| 7,233,274 B1 | * | 6/2007 | Kuhn | 341/161 |
| 2009/0146859 A1 | * | 6/2009 | Terranova | 341/159 |

* cited by examiner

*Primary Examiner*—Lam T Mai
(74) *Attorney, Agent, or Firm*—Hamilton, Brook, Smith & Reynolds, P.C.

(57) ABSTRACT

A differential reference ladder with an auto zero circuit that can be used as part of a flash analog to digital converter. The auto zero operation is performed relative to a common mode voltage of the ladder. The resistive ladder is disconnected from the rest of the circuit during auto zero mode. As a result, the auto zero adjustment is more accurate, since the offsets are stored under the same common mode connection as when the circuit is in a compare mode. This permits auto zeroing to proceed quickly unencumbered by the parasitic capacitance of the ladder or other components.

20 Claims, 4 Drawing Sheets

FLASH CONVERTER DIFFERENTIAL REFERENCE LADDER AUTO-ZERO CIRCUIT

RELATED APPLICATION(S)

This application claims the benefit of U.S. Provisional Application No. 61/005,791, filed on Dec. 7, 2007. The entire teachings of the above application(s) are incorporated herein by reference.

BACKGROUND OF THE INVENTION

In precision flash-type Analog-to-Digital (A/D) converters it is often desirable to compensate for the offset of various components. In particular applications, a flash converter can be a component of a larger A/D system. It may be necessary, therefore, to compensate for errors that are introduced by parts of the flash converter or even other parts of a system in which the flash converter is one component.

SUMMARY OF THE INVENTION

More particularly, a differential reference ladder such as can be used with a flash converter may have an auto zero mode. The auto zero operation is performed relative to a common mode voltage of the ladder. Since the ladder itself may introduce stray capacitance, the ladder is preferably disconnected from the rest of the circuit during auto zeroing. This not only improves the accuracy of auto zeroing but also allows it to proceed more quickly, unencumbered by the parasitic capacitance of the ladder.

In a specific embodiment, a resistor divider ladder network establishes a common mode voltage and a set of differential reference voltages. The reference voltages are fed to buffers to isolate the ladder from the rest of the circuit. The buffered voltages are then fed to an array of comparators.

According to one aspect of an embodiment, a series of MOS switches are disposed between the ladder and the buffers, to isolate the ladder during the auto zero mode. The MOS switches are connected to short all of the buffer inputs to the common mode voltage during the auto zeroing. Any ladder buffer offsets, as well as other system offsets, can thus be sampled and stored on capacitors located within each of the comparators.

The auto zeroing process may occur relatively frequently and in periodic fashion, i.e., for example, right before a sample is taken in a flash type A/D converter.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

A description of example embodiments of the invention follows.

Figure 1:
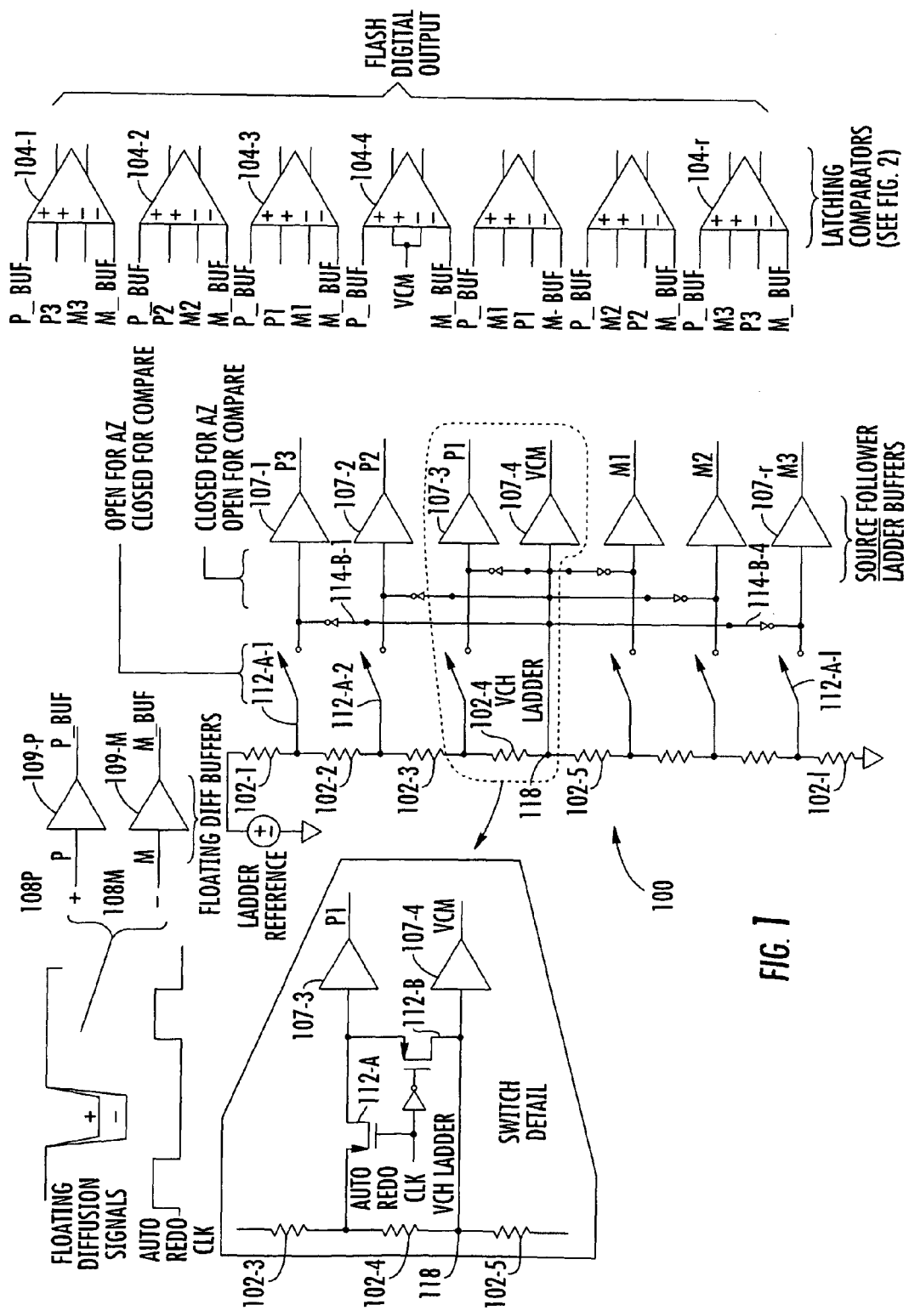
FIG. 1 is a circuit diagram of an auto zero circuit used with a flash converter in accordance with the present invention.

Turning attention now to FIG. 1, a differential reference ladder 100, represented by the plurality of resistors 102-1, 102-2, ..., 102-1, connected in series (in the center of the drawing), provide a set of reference voltages at ladder nodes. The outputs of the reference ladder 100 are used together with a set of comparators 104-1, 104-2, ..., 104-r (on the right hand side) to bin (quantize) the output of a differential floating diffusion (not shown). As will be described in more detail below, this arrangement may, as but one example, be used to sense the charge on a differential floating diffusion that is part of a final stage of a pipelined, charge domain, A/D converter. In the illustrated embodiment there are seven comparators 104 providing seven possible output reference levels P3, P2, P1, Vcm, M1, M2, and M3.

In normal operation of the converter, differential inputs P and M are provided from a pair of floating diffusions 108. A pair of floating diffusion buffers 109-P, 109-M provide respective buffer outputs P_BUF and M_BUF that are then distributed to corresponding inputs of each of a set of dual differential latching comparators 104-1, 104-2, ..., 104-r.

The other inputs of the dual differential latching comparators 110 are fed from source follower buffers 107-1, 107-2, ..., 107-r that provide the seven respective different reference voltage levels. In the illustrated embodiment, a corresponding first mode switch 112-A-1, 112-A-2, ..., 112-A-r is disposed between each node in the reference ladder 100 and a corresponding comparator 104 input, and a corresponding second mode switch 114-B-1, 114-B-2, ..., 114-B-r is disposed between each node in the reference ladder and a common mode reference node 118 (Vcm). In a normal operation mode when the circuit is to provide an A/D flash converter output (a state that is not shown in FIG. 1), mode switches 112-A are placed in a closed position and mode switches 114-B are kept in an open position. As shown in the inset detail, switches 112-A and 114-B may be driven by a clock signal AUTO ZERO CLK.

According to aspects of the preferred embodiment, the ladder incorporates an auto zero mode that is intended to remove offsets of the ladder source follower buffers 107. In this auto zero mode, switches A are open and switches B are closed. This is the state shown in FIG. 1. Auto zero of all of the ladder buffers, including the ladder emitter follower buffers 107 and the floating diffusion buffers 108, are thus performed simultaneously so that amplifier offsets can be stored along with all other offsets on the offset storage capacitors located inside the comparators.

The switches A and B in the illustrated auto zero mode thus cause all inputs to be connected to the common mode reference, Vcm. In the auto zero mode, it does not matter what the resulting actual offset is, as long as all comparators are presented with the same offset.

Figure 2:
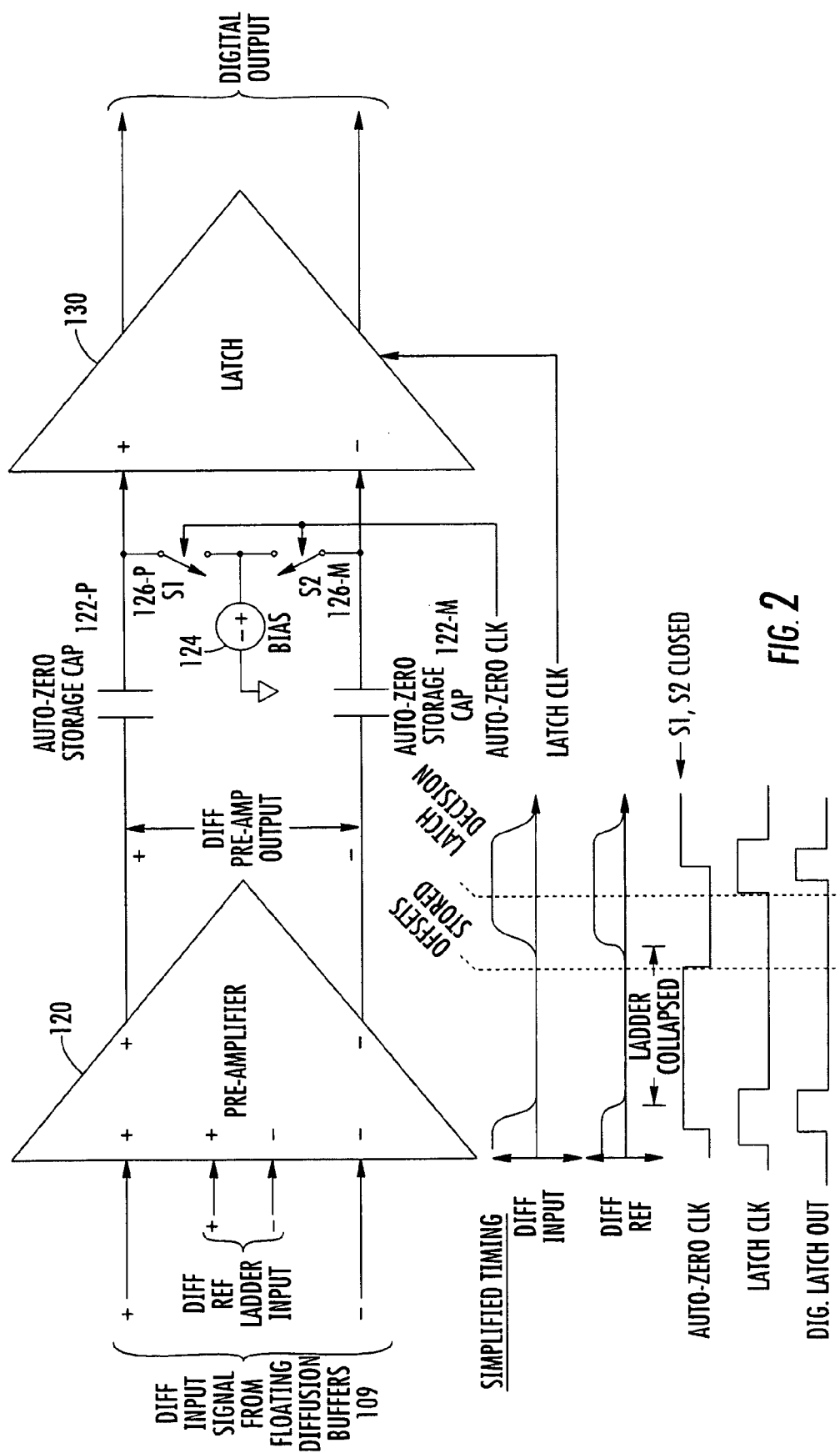
FIG. 2 is a more detailed view of a comparator in one embodiment.

FIG. 2 is a more detailed view of one possible implementation of one of the dual differential latching comparators 104. Note that these incorporate a differential preamplifier 120, a pair of offset storage capacitors 122-P, 122-M, a bias voltage source 124, a pair of switches 126-P (S1) and 126-M (S2) and a differential comparator output latch 130. In operation, the differential latching comparator 104 receives a corresponding pair of the differential ladder outputs (e.g., P3/M3, P2/M2, P1/M1, M1/P1, M2/P2, M3/P3; in the case of comparator 104-4, $V_{CM}$ is fed to both inputs) and the differential input signals (P_BUF and M_BUF) from the differential floating diffusion buffers 106. During the auto zero mode (when AUTO ZERO CLK is a logic high value), switches S1 and S2 are closed, setting the output terminal side of each storage capacitor 122-P, 122-M to the fixed bias voltage set by source 124, but allowing any offset in either the P or M channel in this mode to settle across the respective capacitor. Once the switches S1 and S2 are opened during the normal charge sampling mode (when AUTO ZERO CLK is a logic low), the voltage stored on each capacitor is then introduced to each differential channel provide a corresponding offset adjustment. Note that during this mode, the latch 130 is also clocked at some point to store the result.

Thus, it is understood how a resistive divider (the resistor ladder 100 of FIG. 1) establishes a common mode voltage Vcm and a set of differential reference voltages (e.g., P3, P2, P1, M1, M2, M3) for an array of comparators 104. A set of MOS switches, 112-A and 114-B, disposed between the nodes of the ladder 100 and the ladder output buffers 107, isolate the ladder during an auto zero mode. In particular, the MOS switches 112-A and 114-B short all of the buffer inputs to the Vcm reference voltage in the auto zero mode. All ladder buffer offsets, as well as other system offsets (such as may be introduced by preamplifier internal to each comparator 104, can then be sampled and stored on the offset storage capacitors 122 within each comparator circuit 104 in this mode.

The auto zeroing mode may be selected relatively frequently and in periodic fashion, i.e., for example, it may be selected right before each time the normal mode is selected to take a sample of the P and M differential inputs.

Figure 3:
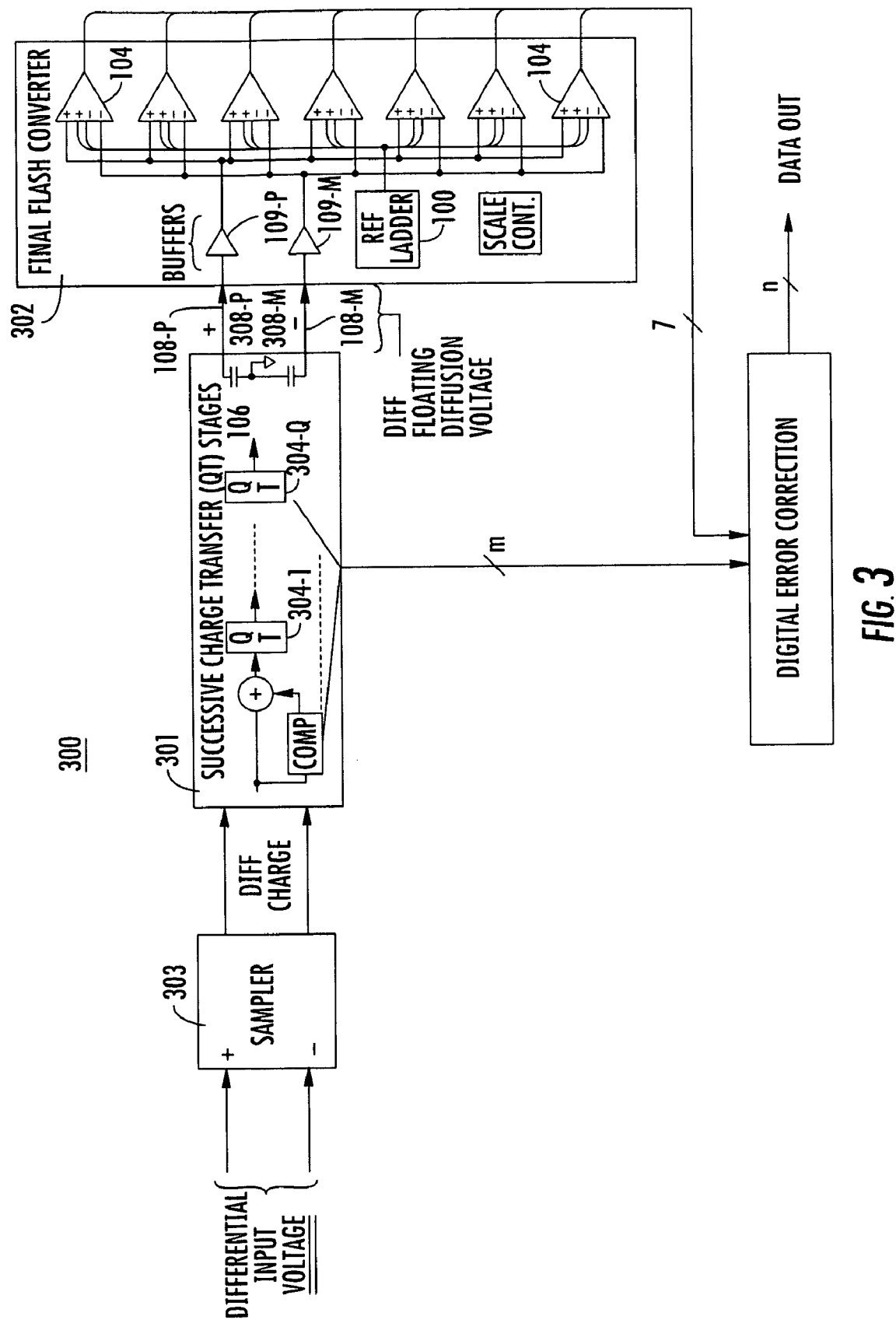
FIG. 3 is a block diagram illustrating use of the flash converter in a charge domain pipeline A/D converter.

FIG. 3 is a high level block diagram of a charge domain pipelined A/D converter 300 that may be implemented using the resistive ladder and auto zero circuits of FIGS. 1 and 2. The converter 300 consists of a successive-type A/D portion 301 and a flash-type A/D portion 302. The first portion 301 provides "m" of the desired "n" total output bits, and the second portion 302 provides the rest. Note that if the flash provides 7 bits as in the example of FIG. 2, the 7 bits may not appear one for one in the final coded n bits.

More particularly, a differential input voltage sampler 303 provides differential charge signals to the successive-type A/D portion 301 which includes a number of successive charge transfer stages 304-1, . . . 304-$q$ (Qt) arranged in a pipeline to provide the operations needed to carry out charge-domain Analog to Digital conversion: namely charge storage and transfer, charge comparison, and conditional and constant charge addition. These operations can be combined in various ways to carry out a variety of A/D algorithms, which may for example, carry out 1-bit, 1½ bit, 2 bits per stage or in other configurations as described in a co-pending U.S. Patent Publication No. 2008/0246646 entitled "Charge Domain Pipeline Analog to Digital Converter", U.S. Patent Publication filed Jan. 18, 2008, which is incorporated by reference herein.

What is important to note here is that a final stage 304-$s$ provides a remainder charge output to the flash-type A/D portion 302 on a differential pair of floating diffusions 308 that correspond to the inputs to floating diffusion buffers 109-P, 109-M. The flash-type A/D comprising the second portion 302 is otherwise implemented according to the circuits described above in FIGS. 1 and 2, including floating diffusion buffers 106, reference ladder resistors 102, and comparators 104 (shown here partially for reference only as the complete detail is in FIGS. 1 and 2).

Figure 4:
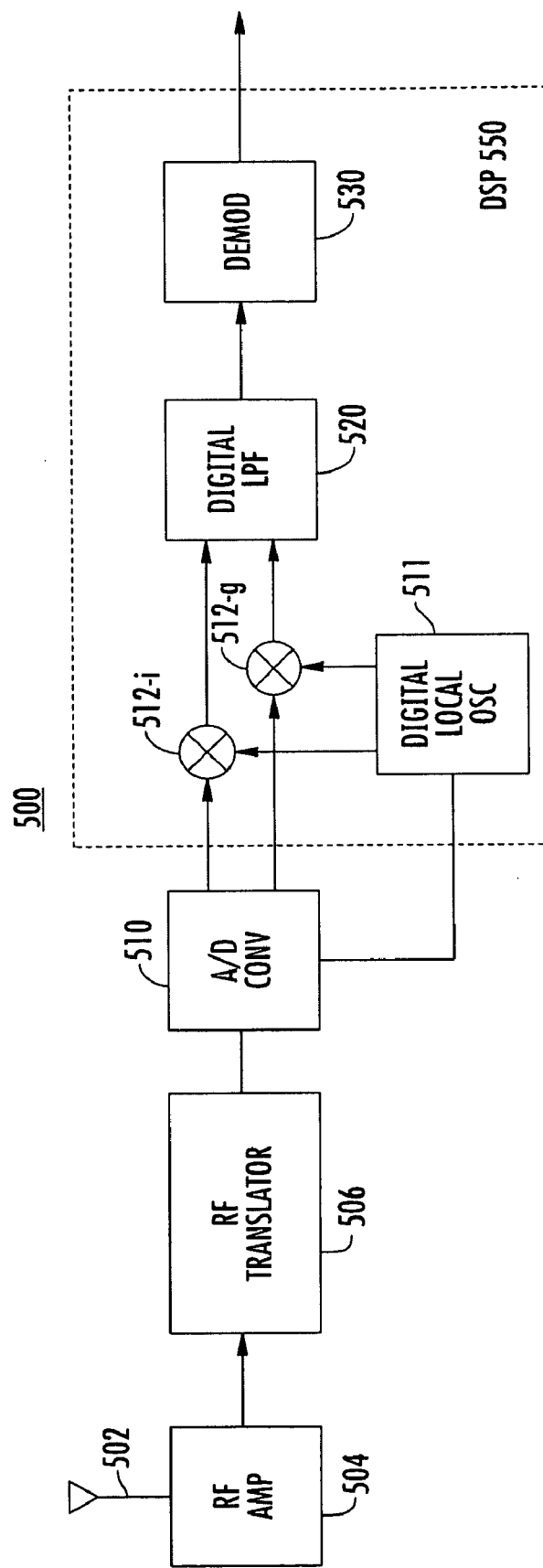
FIG. 4 illustrates an example application of the A/D converter such as in a digital radio frequency signal receiver.

One particular use of the corresponding charge domain pipeline A/D is to implement a digital radio receiver, as generally shown in FIG. 4. A radio frequency (RF) signal is fed to a radio frequency RF amplifier 504. In a wireless application, the RF signal may be received from an antenna 502; in other applications it may be received via a wire. The amplified RF signal is then fed to an RF translator 506 to down-convert the amplified RF signal to an intermediate frequency (IF). After the RF translator 506 (which may be optional) the ADC 510 is then used to digitize the RF input into digital samples for subsequent processing. A digital local oscillator 511 may operate digital mixers 512-$i$ and 512-$q$ to provide for in phase and quadrature samples thereof. A digital low pass filter 520 limits the frequency content of resulting signal to the desired bandwidth. A demodulator 530 then recovers the original modulated signal from the same. One or more of the operations of the digital local oscillator 511, mixers 512, low pass filter 520 and/or demodulator 530 may be implemented in a digital signal processor 550. The recovered signal may then be further processed converted back to an analog baseband signal or the like, depending on the specific end application of the digital receiver.

While this invention has been particularly shown and described with references to example embodiments thereof, it will be understood by those skilled in the art that various changes in form and details may be made therein without departing from the scope of the invention encompassed by the appended claims.

What is claimed is:

1. An apparatus comprising:
    an array of comparators;
    a resistive ladder, comprising a plurality of resistors, for establishing a common mode voltage and two or more reference voltages;
    a plurality of buffers, for buffering the common mode voltage and reference voltages;
    a plurality of switches, disposed between the resistive ladder and output buffers, to isolate the resistive ladder in an auto zero mode, by coupling the buffer inputs to the common mode voltage in the auto zero mode; and
    at least one offset storage capacitor associated with each comparator for storing an auto zero offset voltage sampled in the auto zero mode.

2. The apparatus of claim 1 wherein the comparators are further arranged to have a first input coupled to receive an input signal sample and a second input coupled to receive a corresponding output of one of the buffers.

3. The apparatus of claim 2 wherein the outputs of the comparators provide a flash-type analog to digital converter having an output representative of the input signal sample.

4. The apparatus of claim 2 additionally wherein the switches are arranged so that, during a normal sample mode, the common mode voltage and reference voltages from the ladder are not isolated from and coupled to inputs of corresponding ones of the buffers.

5. The apparatus of claim 4 wherein the auto zero mode is enabled prior to taking each of a series of input signal samples.

6. The apparatus of claim 1 wherein each of the plurality of switches further comprises:
    a series connected switch, disposed in series between one of the resistors and an input of a corresponding buffer; and
    a common mode switch, connected between the common mode voltage and the inputs of the buffers.

7. The apparatus of claim 2 wherein the input signal sample is taken from a floating diffusion.

8. The apparatus of claim 2 wherein the input signal sample is provided as a differential floating diffusion, the reference ladder provides differential reference voltages, and each of the comparators provide a differential comparator output.

9. The apparatus of claim 3 wherein the analog to digital converter is part of a digital radio frequency receiver.

10. A flash analog to digital converter apparatus comprising:
    a differential resistive ladder, for establishing a common mode voltage and two or more reference voltages;
    a plurality of buffers, for buffering the common mode voltage and differential reference voltages;
    a plurality of switches, disposed between the resistive ladder and output buffers, to isolate the resistive ladder in an auto zero mode, by coupling the buffer inputs to the common mode voltage;
    an array of differential comparators, each connected to receive a differential input signal sample and a differential pair of the reference voltages; and
    a pair of storage capacitors associated with each differential comparator, for storing a differential auto zero offset voltage sampled in the auto zero mode.

11. A method comprising:
    establishing a common mode voltage and two or more reference voltages at respective output nodes of a resistive voltage ladder;
    buffering the common mode voltage and reference voltages;
    comparing the buffered reference voltages and common mode voltage to an input signal sample;
    isolating the output nodes of the resistive ladder in an auto zero mode, by coupling the buffered reference voltages to the common mode voltage in the auto zero mode; and
    sampling an auto zero offset voltage in the auto zero mode.

12. The method of claim 11 further comprising:
    storing the sampled auto zero offset voltage in the auto zero mode.

13. The method of claim 12 wherein the comparing step provide a flash-type analog to digital conversion result representative of the input signal sample.

14. The method of claim 12 additionally comprising:
    during a normal sample mode, coupling the reference voltages to corresponding buffer inputs so that the reference ladder is no longer isolated.

15. The method of claim 14 wherein the auto zero mode is enabled prior to taking each of a series of input signal samples.

16. The method of claim 11 comprising:
    switching a series connection between a node of the ladder and an input of a corresponding buffer; and
    switching a common mode connection between the common mode voltage and the inputs of the buffers.

17. The method of claim 12 wherein the input signal sample is taken from a floating diffusion.

18. The method of claim 12 wherein the input signal sample is provided as a differential floating diffusion, the reference ladder provides differential reference voltages, and each of the comparators provide a differential comparator output.

19. The method of claim 13 wherein the analog to digital converter is part of a digital radio frequency receiver.

20. A method of providing a flash analog to digital conversion result comprising:
    establishing a common mode voltage and two or more reference voltages at a differential ladder;
    buffering the common mode voltage and differential reference voltages at a plurality of buffers;
    operating a plurality of switches, disposed between the resistive ladder and output buffers, to isolate the resistive ladder in an auto zero mode, by coupling the buffer inputs to the common mode voltage;
    providing a plurality of differential comparison results, by comparing a differential input signal sample and a differential pair of the reference voltages; and
    storing a differential auto zero offset voltage sampled in the auto zero mode on a pair of storage capacitors.

* * * * *